(12) United States Patent
Sonntag

(10) Patent No.: US 8,975,970 B2
(45) Date of Patent: Mar. 10, 2015

(54) PRODUCING A DESIRED FREQUENCY USING A CONTROLLED OSCILLATOR WITH KNOWN TEMPERATURE SENSITIVITY

(75) Inventor: Jeffrey L. Sonntag, Portland, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 12/774,453

(22) Filed: May 5, 2010

(65) Prior Publication Data

US 2011/0187462 A1 Aug. 4, 2011

Related U.S. Application Data

(60) Provisional application No. 61/300,368, filed on Feb. 1, 2010.

(51) Int. Cl.
*H03L 7/00* (2006.01)
*H03L 1/02* (2006.01)

(52) U.S. Cl.
CPC ........................................ *H03L 7/00* (2013.01)
USPC ................. 331/34; 331/18; 331/44; 331/176; 327/155

(58) Field of Classification Search
USPC ........ 331/1 A, 1 R, 16, 18, 34, 44, 46–49, 65, 331/66, 176; 327/146, 147, 155, 156; 375/373–376
See application file for complete search history.

(56) References Cited

U.S. PATENT DOCUMENTS

| | | | |
|---|---|---|---|
| 4,443,116 A * | 4/1984 | Yoshida et al. | 368/202 |
| 4,980,586 A * | 12/1990 | Sullivan et al. | 327/262 |
| 5,182,528 A * | 1/1993 | Zuta | 331/1 A |
| 5,604,468 A * | 2/1997 | Gillig | 331/176 |
| 6,081,164 A * | 6/2000 | Shigemori et al. | 331/16 |
| 6,522,212 B1 * | 2/2003 | Kodim | 331/176 |
| 6,831,525 B1 | 12/2004 | Beaudin et al. | |
| 7,211,926 B2 | 5/2007 | Quevy et al. | |
| 7,212,075 B2 * | 5/2007 | Young et al. | 331/176 |
| 7,288,998 B2 | 10/2007 | Thomsen et al. | |
| 7,295,077 B2 | 11/2007 | Thomsen et al. | |
| 7,332,975 B2 | 2/2008 | Marques | |

(Continued)

OTHER PUBLICATIONS

Silicon Labs, "Advances in Silicon Technology Enables Replacement of Quartz-Based Oscillators," 8 pages, Oct. 31, 2008, URL: <http://www.silabs.com/support/pages/support.aspx?ProductFamily=Silicon XOs/SiliconOscillatorWhitePaper.pdf>.

(Continued)

*Primary Examiner* — Levi Gannon
(74) *Attorney, Agent, or Firm* — Abel Law Group, LLP

(57) ABSTRACT

A controlled oscillator is tuned to produce a desired, temperature independent frequency. A first frequency ratio is determined between a first frequency of the output signal generated by the controlled oscillator and a frequency of an output signal from another oscillator. The first frequency is determined based on a sensed temperature. A desired frequency of the output signal of the controlled oscillator is used to determine a desired frequency ratio between the desired frequency and the frequency of the output signal from the other oscillator. The controlled oscillator is tuned and the frequency ratio measured until the tuning has caused the desired frequency ratio to be achieved, thereby causing the controlled oscillator to provide the desired frequency.

24 Claims, 4 Drawing Sheets

(56) References Cited

U.S. PATENT DOCUMENTS

| | | |
|---|---|---|
| 7,436,227 B2 | 10/2008 | Thomsen et al. |
| 7,511,870 B2 | 3/2009 | Ho et al. |
| 7,541,878 B2 * | 6/2009 | Haiut ............................... 331/2 |
| 7,671,688 B2 | 3/2010 | Marques |
| 7,755,441 B1 | 7/2010 | Cioffi et al. |
| 7,760,036 B2 | 7/2010 | Sutardja |
| 7,876,167 B1 | 1/2011 | McCraith et al. |
| 7,982,550 B1 | 7/2011 | Quevy et al. |
| 8,446,223 B2 * | 5/2013 | Gronemeyer .................... 331/44 |
| 2005/0237119 A1 * | 10/2005 | Irie ................................ 331/16 |
| 2007/0146082 A1 * | 6/2007 | Ohara et al. .................... 331/16 |
| 2009/0257529 A1 * | 10/2009 | Popplewell et al. .......... 375/320 |
| 2010/0093125 A1 | 4/2010 | Quevy et al. |
| 2011/0210797 A1 | 9/2011 | Quevy et al. |

OTHER PUBLICATIONS

Zamora et al., "A 1.5mW, 200MHz CMOS VCO for Wireless Biotelemetry," Stanford University, 1997, 14 pages.

U.S. Appl. No. 13/285,608, filed Oct. 31, 2011, entitled, "MEMS Stabilized Oscillator," naming inventors Quevy et al.

\* cited by examiner

PRODUCING A DESIRED FREQUENCY USING A CONTROLLED OSCILLATOR WITH KNOWN TEMPERATURE SENSITIVITY

CROSS-REFERENCE TO RELATED APPLICATION(S)

This application claims benefit to provisional application 61/300,368, filed Feb. 1, 2010, entitled "Producing a Desired Frequency Using a Controlled Oscillator with Known Temperature Sensitivity," naming Jeffrey L. Sonntag as inventor, which application is incorporated herein by reference in its entirety.

BACKGROUND

1. Field of the Invention

This invention relates to generating signals having a desired frequency.

2. Description of the Related Art

Many approaches have been utilized to provide clock signals for modern electronic systems. In a crystal-less clock generator system, which needs to produce a signal with a precise frequency, but without the use of a crystal oscillator, one approach uses temperature compensation to adjust an output of a controlled oscillator, e.g., a voltage controlled oscillator (VCO), based on measured temperature. Such an approach essentially records the exact settings of the VCO fine tuning controls as a function of measured frequency that result in the correct output frequency at a particular temperature. Because both fine and coarse VCO tuning controls are generally not sufficiently accurate or temperature insensitive, accuracy is achieved only when the generated frequency is precisely the same as was used during the production test measurements. Therefore, parts using such an approach are tuned in production test for a particular frequency, and cannot produce any other frequency accurately.

In another prior art system, a crystal-based reference clock, which is not precise and is somewhat temperature dependent, is used to tune a controlled oscillator to produce an output clock. In this case, the nominal frequency (and even temperature sensitivity) of the crystal reference can be learned in test, then an arbitrary desired output clock can be produced using a fractional-N phase-locked loop (PLL) or frequency-locked loop (FLL). However, that approach requires that two oscillators, the reference oscillator and the controlled oscillator, exist and be constantly powered, thus incurring substantial hardware area and power costs in addition to the possibility of spurs arising from energy at the reference clock frequency leaking into the output clock.

SUMMARY OF EMBODIMENTS OF THE INVENTION

Accordingly, in one embodiment, a method is provided for producing an output signal having a desired frequency from a controlled oscillator. The method includes determining a first frequency ratio between a first frequency of the output signal generated by the controlled oscillator and a second frequency of another output signal from another oscillator. A desired frequency ratio is determined between the desired frequency of the output signal generated by the controlled oscillator and the second frequency of the other output signal from the other oscillator. The controlled oscillator is tuned to achieve the desired frequency ratio and thereby produce the output signal having the desired frequency. The method further includes determining the first frequency ratio in a frequency ratio measuring circuit and after determining the first frequency ratio, determining one or more additional frequency ratios in the frequency ratio measuring circuit responsive to the tuning of the controlled oscillator, until the desired frequency ratio is substantially reached.

In another embodiment, an apparatus is provided that includes a controlled oscillator to supply a controlled oscillator output signal. A second oscillator supplies a second oscillator output signal. A frequency ratio measurement circuit is coupled to the controlled oscillator output signal and the second oscillator output signal, and supplies an indication of a frequency ratio between the controlled oscillator output signal and the second oscillator output signal. A control circuit is coupled to receive the frequency ratio indication and to adjust tuning of the controlled oscillator according to the ratio indication.

In another embodiment, a computer program product is provided that is stored on computer readable storage media. The computer program product is operable when executed on a processor, to determine a first frequency of a controlled oscillator output signal according to a measured temperature. The computer program product is responsive to a first frequency ratio between the first frequency of the controlled oscillator output signal and a frequency of a second oscillator output signal from a second oscillator to determine a desired ratio according to a desired frequency of the controlled oscillator output signal and the frequency of the second oscillator output signal. The computer program product iteratively provides control values to tune the controller oscillator output signal until a measured frequency ratio is substantially equal to the desired frequency ratio.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

It would be desirable to tune a controlled oscillator to produce a desired, temperature independent frequency without requiring the continuous operation of a second reference oscillator. Such an approach would eliminate the need for a reference clock source located on or off chip, as required in the prior art described above using a crystal-based reference. That provides the advantage of allowing for on the fly frequency selection. "On the fly" selection of frequency allows production of multiple frequencies from a single device at different times (e.g., to transmit a burst of data at multiple carrier frequencies sequentially, or dynamic production of any frequency under direct customer control). Providing multiple frequencies from a single device also simplifies inventory and supply management issues by not requiring a different part number for each frequency a customer might want to use.

Figure 1:
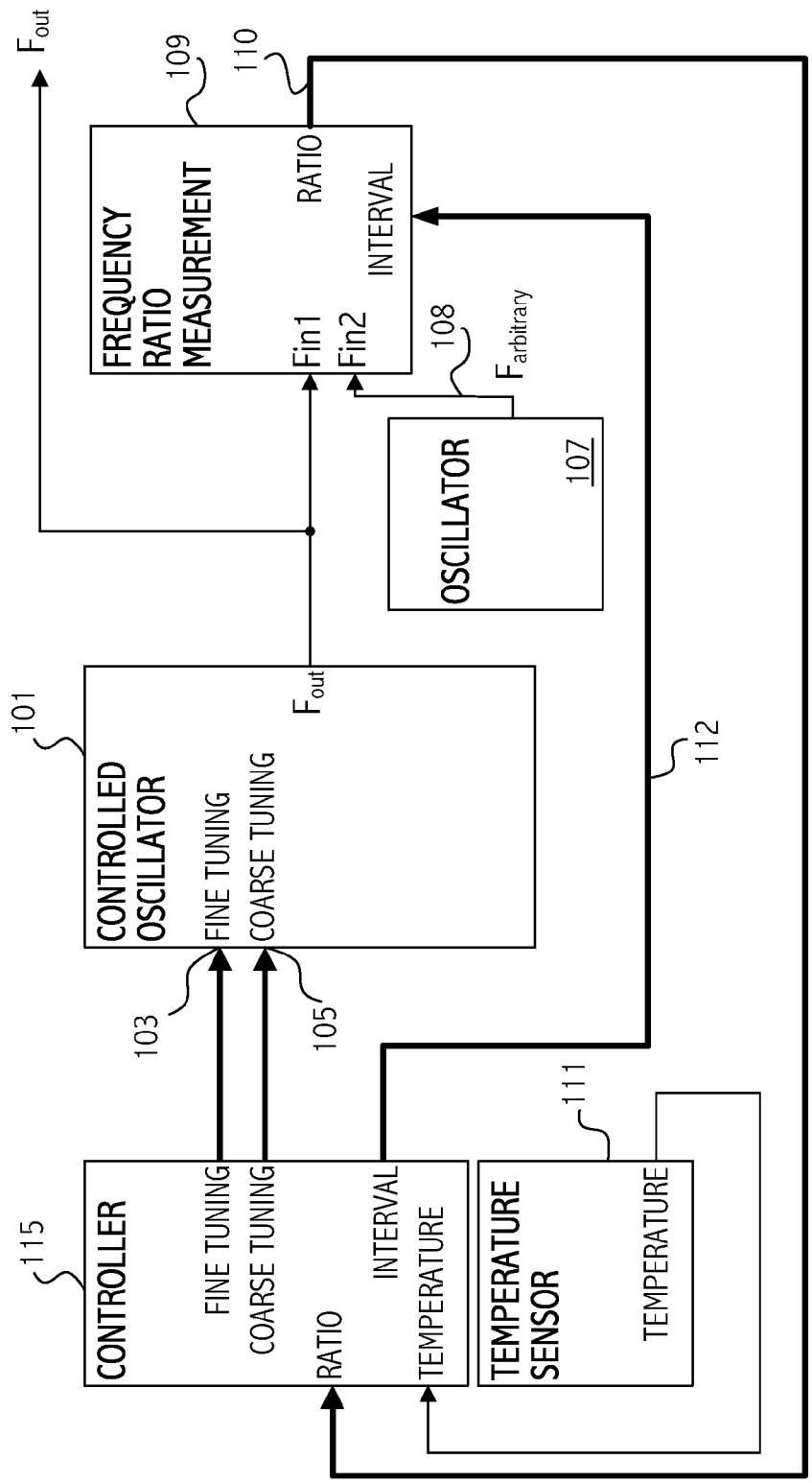
FIG. 1 illustrates a functional block diagram of an embodiment of the invention.

An embodiment of the present invention utilizes "frequency casting" to tune a controlled oscillator to produce a desired, temperature independent frequency without requiring the continuous operation of a second reference oscillator. A frequency ratio is used to generate the desired frequency as discussed further herein. Referring to FIG. 1, an embodiment of the invention utilizes a controlled oscillator 101 having a fine tuning control port 103 that may be analog or digital. An embodiment may further include a coarse tuning control port 105. The controlled oscillator 101 has a known frequency vs temperature sensor output characteristic, known at least when the fine and coarse tuning ports are fixed at a predetermined setting. The relationship between temperature and frequency may be determined in a number of ways. For example, in an embodiment, at predetermined tuning settings the output frequency is a known function of temperature:

$$F_{out} = \sum_{i=0}^{order} a_i \cdot T^i.$$

Thus, the relationship between temperature and frequency may be stored in polynomial coefficients. Alternatively, the relationship between temperature and frequency may be stored in table entries and interpolation used to determine the frequency at temperatures between the entries. The controlled oscillator may be an LC implementation of a voltage controlled oscillator (VCO). The fine tuning control port should have some linear range, at least enough to allow for continued adjustments to compensate for temperature changes as described further herein.

A second oscillator 107 provides an output signal 108 with a frequency $F_{arbitrary}$ that is used in determining a ratio as described further herein. The oscillator 107 does not need to have an accurately known frequency or low temperature sensitivity. The oscillator 107 needs to have sufficiently small low frequency (1/f) noise so that two time-adjacent frequency measurements produce largely the same result (a low Allen deviation). In an exemplary embodiment, a ring oscillator can be used that meets the low Allen deviation requirement. Other oscillators can also be used that meet the low Allen deviation requirement. The oscillator 107 may be used to provide clock signals to other logic on the integrated circuit, not shown in FIG. 1. Note that in some embodiments, the oscillator 107 may be powered off when not being used for ratio measurements.

A frequency ratio measurement circuit 109 includes, e.g., a frequency counter, capable of accurately measuring the frequency ratio between the controlled oscillator's output clock frequency ($F_{out}$), and the output clock signal frequency ($F_{arbitrary}$) of oscillator 107. The frequency ratio measurement circuit 109 supplies the determined ratio over signal lines 110 to the controller 115. In an embodiment, the controller 115 controls frequency ratio measurement circuit 109 via a digital control bus 112.

A temperature sensor 111 measures the temperature and supplies the measurement to the controller 115. The temperature sensor can be of any type of sensor that produces an output compatible with the controller 115. Note that absolute accuracy of the temperature sensor 111 is unimportant if the polynomial coefficients (or table entries for embodiments using interpolation) relate not to absolute temperature but to the output of the temperature sensor.

The controller 115 provides control and computation functionality to generate the tuning information necessary to control the controlled oscillator at any desired frequency which is within its tuning range. In addition, the controller 115 produces the necessary tuning information that is required to make necessary adjustments in the fine tuning control proportional to measured changes in temperature subsequent to the initial tuning operation. Note that in a typical embodiment, the circuitry shown in FIG. 1 is embodied on a single integrated circuit.

An important aspect associated with frequency casting is that one can program the controlled oscillator to its predetermined tuning and measure the temperature. Using the temperature and a polynomial or table entries (where the polynomial coefficients or table entries were determined for the settings of the tuning controls), the exact $F_{out}$ ($F_{out\_predetermined}$) is then known. The predetermined ratio of the oscillator 101 output to the oscillator 107 output can be measured:

$$R_{predetermined} = \frac{F_{outpredetermined}}{F_{arbitrary}} \quad \text{Eq. 1}$$

In order to adjust the frequency of the controlled oscillator 101 to a new desired frequency, the new tuning setting for the controlled oscillator can be determined based on a ratio of the desired frequency to the oscillator 107 output frequency. The desired ratio can be calculated as:

$$R_{desired} = \frac{F_{out\_desired}}{F_{arbitrary}} = R_{predetermined} \cdot \frac{F_{out\_desired}}{F_{out\_predetermined}}. \quad \text{Eq. 2}$$

Some combination of linear search, binary search, and/or Newton's method may be used to determine the combination of coarse and fine tuning values that produce $R_{desired}$ as the measured frequency ratio.

The assumption above is that the frequency of the oscillator 107 is the same during the first (predetermined) ratio measuring event as it is later, during the final (desired) ratio measuring event. To the extent that the Allen deviation of the oscillator 107 is nonzero, there will be some difference, causing an overall error.

For most oscillator types, the Allen deviation is larger for shorter ratio measurement intervals and smaller for larger ratio measurement intervals. In a time-efficient implementation of the algorithm, most of the ratio measurements can be done with quite small intervals (producing noisy results) with the long measurement intervals used only for the final, e.g., two ratio measurements.

Figure 2:
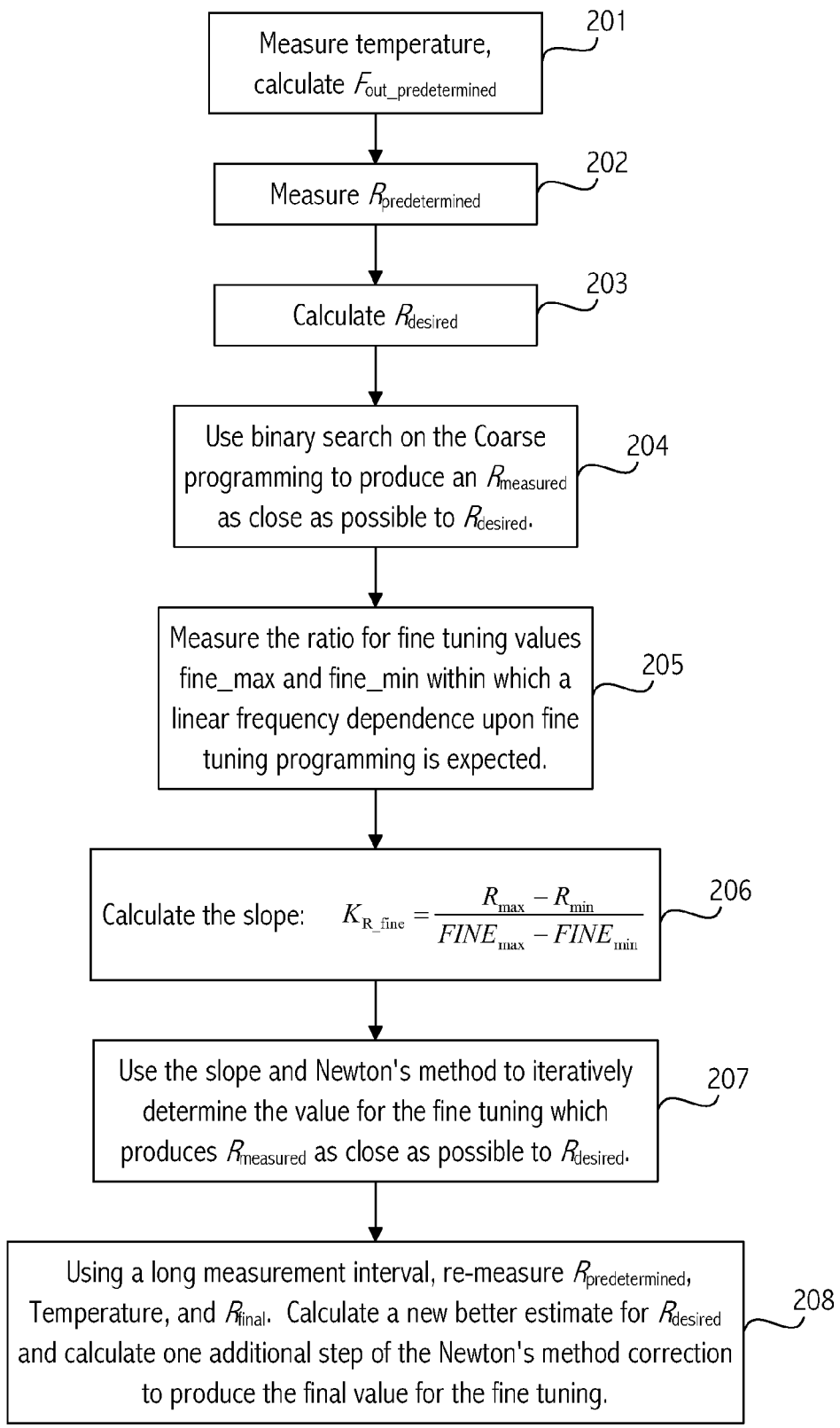
FIG. 2 illustrates a flow diagram of an embodiment of the invention.

Referring to FIG. 2, illustrated is a flow diagram of an embodiment of the invention. In 201, the temperature is measured in temperature sensor 111, and $F_{out\_predetermined}$ is calculated using the polynomial and the measured temperature. In 202, the ratio $R_{predetermined}$ is measured in frequency ratio measurement circuit 109. In 203, $R_{desired}$ is calculated based on the $F_{out\_desired}$. In 204, a binary search is used on the coarse programming control to produce an $R_{measured}$ as close as possible to $R_{desired}$. In 205, the ratio for fine tuning values fine_max and fine_min are measured within which a linear frequency dependence upon fine tuning programming is expected. In 206, the slope is calculated:

$$K_{R\_fine} = \frac{R_{max} - R_{min}}{FINE_{max} - FINE_{min}}.$$

In 207, the slope and Newton's method is used to iteratively determine the value for the fine tuning which produces $R_{measured}$ as close as possible to $R_{desired}$. While the embodiment illustrated in FIG. 2 uses a binary search for the coarse tuning and Newton's method for the fine tuning, other embodiments may utilize any other effective search or calculation technique.

In 208, which may be optional in some embodiments, a long measurement interval is used to re-measure $R_{predetermined}$, temperature, and $R_{final}$. A new, better estimate for $R_{desired}$ is calculated and one (or more) additional step(s) of Newton's method is calculated to produce the final value for the fine tuning.

Figure 3:
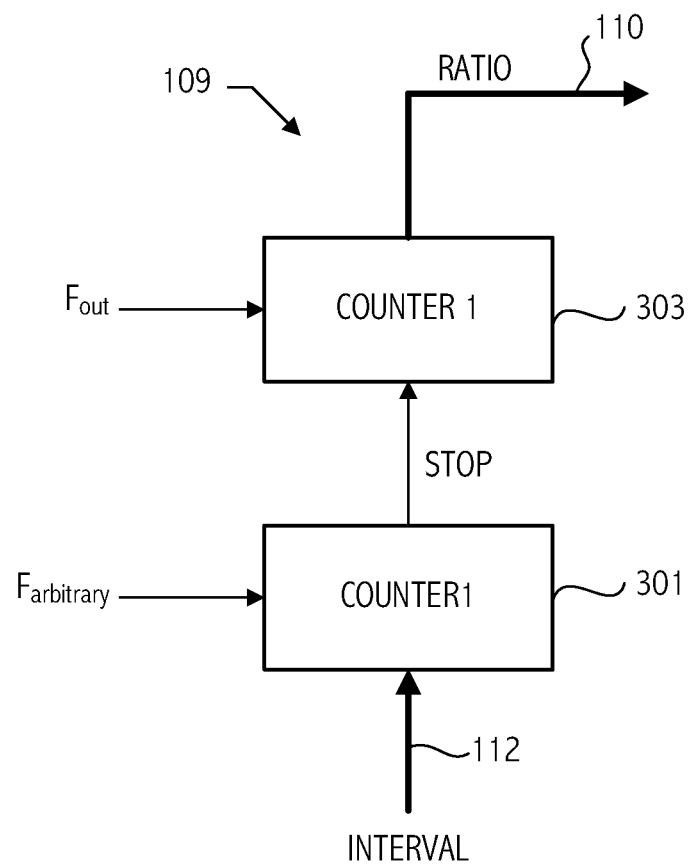
FIG. 3 illustrates an exemplary embodiment of a frequency ratio measurement circuit.

Referring again to FIG. 1 and to FIG. 3, note that the clock signals supplied by oscillator 107 and the controlled oscillator 101 will be of different frequencies. Assume, e.g., that the clock signals supplied by oscillator 107 are a "slow" clock and the clock signals supplied by the controlled oscillator 101 are a "fast" clock. In an exemplary embodiment, the frequency ratio measurement circuit 109 includes two counters. One counter 301 has the slow clock as an input. For each measurement, the slow counter is preset to a value supplied as a digital value on the interval control bus 112. In other embodiments, the interval value for the slow counter may be fixed. The slow counter counts down to zero and stops. The time while this counter is counting down is the "counting interval." A second counter 303 has the fast clock as an input. It starts at zero, and counts (up) only during the counting interval. At the end of the counting interval, the second counter 303 is stopped, with a count value proportional to the ratio of the fast clock frequency to the slow clock frequency.

In many system uses, after tuning, it is desirable to perform an operation (enabling an output driver or transmitter) which would cause a change in the power consumption of the device and drive a change in temperature. Assuming that the derivative of the frequency vs. temperature polynomial function is not zero at the current temperature, such a temperature increase would cause a frequency change.

The change in the fine tuning required to compensate for a change in temperature is given by:

$$\Delta_{fine\_tuning} = \Delta_{Temperature} \cdot \frac{dF_{out}}{dT} \cdot \frac{dR}{dF_{out}} \Big/ \frac{dR}{d\text{Fine\_Tuning}} \qquad \text{Eq. 3}$$

Note that the $$\frac{dF_{out}}{dT}$$

can be calculated from the polynomial, $$\frac{dR}{dF_{out}}$$

can be written as $$\frac{R}{F_{out}}$$

and easily calculated, and $$\frac{dR}{d\text{Fine\_Tuning}}$$

corresponds to the $K_{R\_fine}$, which was learned in the tuning step.

In one implementation, much of the math can be done just once, storing the result as "K", allowing a very simple adjustment to be made with each new temperature sample, T:

$$\text{Fine\_Tuning} = \text{Fine\_Tuning}_0 + K \cdot (T - T_0), \text{ where} \qquad \text{Eq. 4}$$

$$K = \frac{d}{dT}\left(F_{out} = \sum_{i=0}^{order} a_i \cdot T^i\right) \cdot \frac{R}{F_{out}} \Big/ K_{R\_fine} \qquad \text{Eq. 5}$$

Figure 4:
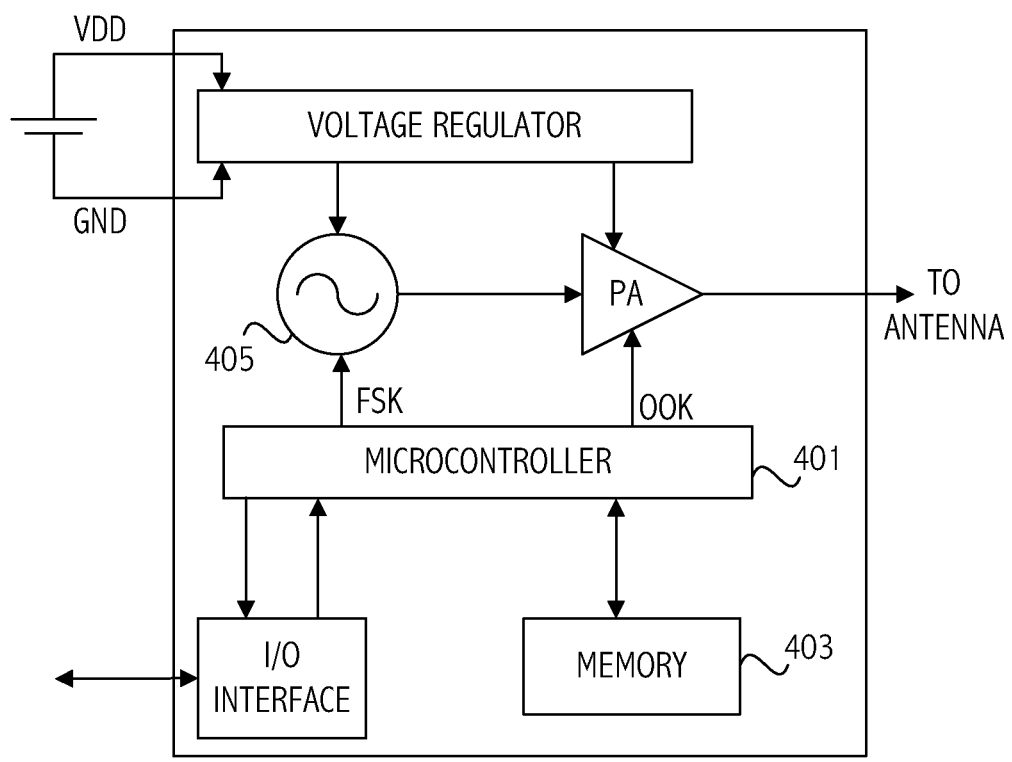
FIG. 4 illustrates an exemplary short range transmitting device incorporating an embodiment of the invention.

Referring to FIG. 4, in an embodiment, the controller 115 is a processor 401 such as a programmable digital signal processor (DSP) or a microcontroller on the same die as the rest of the hardware. The software to implement the functionality of the controller on the DSP or microcontroller may be stored in computer readable storage media 403 that may include RAM, ROM, One Time Programmable (OTP) memory, EEPROM, or other storage media or a combination of any of the preceding. In other embodiments, the controller may be implemented as hardwired logic, or in a Field Programmable Gate Array (FPGA), or in some computer resource off-chip. FIG. 4 also illustrates a high level diagram of an exemplary short range transmitting device application providing frequency shift keying (FSK) or on off keying (OOK), where the oscillator 405 incorporates "frequency casting" as described above to achieve desired oscillator frequencies.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. A method of producing an output signal having a desired frequency from a controlled oscillator comprising:
   measuring a temperature associated with the controlled oscillator at a predetermined setting of the controlled oscillator;
   determining a first frequency of the output signal of the controlled oscillator based on the measured temperature;
   receiving the output signal and another output signal from another oscillator at a frequency ratio measuring circuit;
   calculating a first frequency ratio in the frequency ratio measuring circuit by comparing the determined first frequency of the output signal generated by the controlled oscillator and a second frequency of the other output signal from the other oscillator;
   calculating a desired frequency ratio between the desired frequency of the output signal generated by the controlled oscillator and the second frequency of the other output signal from the other oscillator, using the first frequency ratio and the desired frequency;

changing the output signal to have the desired frequency by tuning the controlled oscillator until the desired frequency ratio is substantially achieved.

2. The method as recited in claim 1 wherein changing the output signal to have the desired frequency further comprises determining respective additional frequency ratios responsive to respective changes in the tuning until the desired frequency ratio is substantially achieved.

3. The method as recited in claim 2 further comprising:
determining a first plurality of the additional frequency ratios in the frequency ratio measuring circuit using a first measurement interval; and
using a second measurement interval, longer than the first, to determine at least one of the additional frequency ratios.

4. The method as recited in claim 3 further comprising setting the first measurement interval by supplying a first counter clocked with the other output signal with a first predetermined value and setting the second measurement by supplying the first counter with a second predetermined value.

5. The method as recited in claim 1 wherein the tuning of the controlled oscillator comprises employing a search algorithm to determine tuning control values.

6. The method as recited in claim 1 wherein measuring the first frequency ratio comprises:
counting a predetermined value in a first counter clocked using the other output signal from the other oscillator; and
counting in a second counter clocked using the output signal from the controlled oscillator and stopping counting when the predetermined value has been counted by the first counter, a value in the second counter upon stopping corresponding to the first frequency ratio.

7. The method as recited in claim 6 wherein the predetermined value is fixed.

8. The method as recited in claim 1 further comprising:
after achieving the desired frequency ratio, adjusting tuning of the controlled oscillator in response to a temperature change.

9. The method as recited in claim 1 wherein the desired frequency ratio ($R_{desired}$) is calculated as $$R_{desired} = R_{predetermined} \times \frac{F_{out\_desired}}{F_{out\_predetermined}},$$

wherein $R_{predetermined}$ is the first frequency ratio and $F_{out\_predetermined}$ is the first frequency and $F_{out\_desired}$ is the desired frequency.

10. The method as recited in claim 1 further comprising:
adjusting coarse tuning of the controlled oscillator responsive to one or more frequency ratios and adjusting fine tuning of the controlled oscillator responsive to another of the frequency ratios to substantially reach the desired frequency ratio.

11. The method as recited in claim 1 wherein the second oscillator output signal has a frequency that is not accurately known.

12. The method as recited in claim 1 further comprising after the desired frequency ratio is substantially achieved, producing the output signal with the desired frequency from the controllable oscillator without use of the other oscillator.

13. An apparatus comprising:
a controlled oscillator to supply a controlled oscillator output signal;
a second oscillator to supply a second oscillator output signal;
a frequency ratio measurement circuit coupled to the controlled oscillator output signal and the second oscillator output signal, and to generate and to supply respective indications of measured frequency ratios between the controlled oscillator output signal and the second oscillator output signal; and
a control circuit coupled to receive the indications of the measured frequency ratios and compare the measured frequency ratios to a desired frequency ratio and to adjust tuning of the controlled oscillator until the desired frequency ratio is substantially achieved between a desired frequency of the controlled oscillator output signal and the second oscillator output signal,
wherein the desired frequency ratio is calculated using the desired frequency and a first frequency ratio, wherein the first frequency ratio is calculated by comparing a determined first frequency of the controlled oscillator output signal and a second frequency of the second oscillator output signal.

14. The apparatus as recited in claim 13 further comprising a temperature sensor coupled to supply a temperature measurement to the control circuit.

15. The apparatus as recited in claim 13 wherein the frequency ratio measurement circuit further comprises:
a first counter coupled to count the controlled oscillator output signal; and
a second counter coupled to count the second oscillator output signal;
wherein the first counter is configured to begin counting when the second counter begins counting and to stop counting when the second counter has counted a predetermined value.

16. The apparatus as recited in claim 15 wherein after the first counter stops counting, a count value in the first counter corresponds to the indication of the frequency ratio.

17. The apparatus as recited in claim 15 wherein the control circuit controls a duration during which each of the frequency ratios is determined by supplying the predetermined value.

18. The apparatus as recited in claim 17 wherein the control circuit is configured to vary the duration during which at least one of the frequency ratios is determined as compared to other of the frequency ratios, by using a different predetermined value during determination of the at least one of the frequency ratios.

19. The apparatus as recited in claim 13 wherein the control circuit is configured to employ a search algorithm to adjust tuning of the controlled oscillator, until the measured frequency ratio is substantially the same as the desired frequency ratio.

20. The apparatus as recited in claim 13 wherein the controlled oscillator and second oscillator are disposed on a single integrated circuit die.

21. The apparatus as recited in claim 13 wherein the control circuit is operable to adjust coarse tuning of the controlled oscillator responsive to one or more of the measured frequency ratios and adjust fine tuning of the controlled oscillator responsive to another of the measured frequency ratios.

22. The apparatus as recited in claim 13 wherein the control circuit is configured to determine the first frequency of the controlled oscillator output signal based on a measured temperature associated with the controlled oscillator at a predetermined setting of the controlled oscillator.

23. A computer program stored on computer readable storage media, operable when executed on a processor to cause the processor:

to determine a first frequency of a controlled oscillator output signal from a controlled oscillator based on a measured temperature at a predetermined setting of the controlled oscillator to thereby determine a known first frequency;

to calculate a first frequency ratio between the known first frequency of the controlled oscillator output signal and a second frequency of a second oscillator output signal from a second oscillator;

to calculate a desired frequency ratio between a desired frequency of the controlled oscillator output signal and a frequency of a second oscillator output signal from a second oscillator, using the first frequency ratio and the desired frequency; and to iteratively provide control values to tune the controlled oscillator until a measured frequency ratio between the controlled oscillator output signal and the second oscillator output signal is substantially equal to the desired frequency ratio.

24. The computer program stored as recited in claim 23 wherein the desired frequency ratio ($R_{desired}$) is $$R_{desired} = R_{predetermined} \times \frac{F_{out\_desired}}{F_{out\_predetermined}},$$

wherein $R_{predetermined}$ is the first frequency ratio and $F_{out\_predetermined}$ is the known first frequency and $F_{out\_desired}$ is the desired frequency.

* * * * *